(12) United States Patent
Fahn et al.

(10) Patent No.: US 6,534,396 B1
(45) Date of Patent: Mar. 18, 2003

(54) PATTERNED CONDUCTOR LAYER PASIVATION METHOD WITH DIMENSIONALLY STABILIZED PLANARIZATION

(75) Inventors: Fu-Jier Fahn, Jubei (TW); Kuo-Wei Lin, Hsinchu (TW); James Chen, Hsinchu (TW); Eugene Cheu, Hsinchu (TW); Chien-Shian Peng, Hsinchu (TW); Gilbert Fan, Jubei (TW); Kenneth Lin, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 57 days.

(21) Appl. No.: 09/686,107

(22) Filed: Oct. 10, 2000

(51) Int. Cl.[7] .......................................... H01L 21/4763
(52) U.S. Cl. ........................ 438/632; 438/631; 438/637; 438/646; 438/760; 438/780; 438/781
(58) Field of Search ................................ 438/632, 637, 438/646, 760, 778, 780, 781, 631

(56) References Cited

U.S. PATENT DOCUMENTS 5,700,720 A * 12/1997 Hashimoto .................. 437/195
5,702,568 A * 12/1997 Shin et al. ................ 156/644.1
5,767,009 A * 6/1998 Yoshida et al. ............. 438/613
5,883,001 A    3/1999 Jin et al.
5,891,800 A * 4/1999 Ben-Guigui et al. ........ 438/631
6,046,101 A    4/2000 Dass et al.
6,169,026 B1 * 1/2001 Park et al. .................. 438/632
6,300,152 B1 * 10/2001 Kim ............................ 438/30

* cited by examiner

Primary Examiner—Amir Zarabian
Assistant Examiner—Khanh B. Duong
(74) Attorney, Agent, or Firm—Tung & Associates

(57) ABSTRACT

Within a method for forming a microelectronic fabrication there is first provided a substrate. There is then formed over the substrate a patterned conductor layer having a topographic variation at a periphery of the patterned conductor layer. There is then formed over the substrate and passivating the topographic variation at the periphery of the patterned conductor layer a planarizing passivation layer formed of a thermally reflowable material. There is then formed upon the planarizing passivation layer a dimensionally stabilizing layer. Finally, there is then thermally annealed the microelectronic fabrication to form from the planarizing passivation layer a thermally annealed planarizing passivation layer. By employing formed upon the planarizing passivation layer the dimensionally stabilizing layer, there is attenuated within the thermally annealed planarizing passivation layer replication of the topographic variation at the periphery of the patterned conductor layer.

14 Claims, 3 Drawing Sheets

PATTERNED CONDUCTOR LAYER PASIVATION METHOD WITH DIMENSIONALLY STABILIZED PLANARIZATION

BACKGROUND OF THE INVENTION

1. Field of the Invention

The present invention relates generally to methods for passivating patterned conductor layers within microelectronic fabrications. More particularly, the present invention relates to methods for passivating, with dimensionally stabilized planarization, patterned conductor layers within microelectronic fabrications.

2. Description of the Related Art

Microelectronic fabrications are formed from microelectronic substrates over which are formed patterned microelectronic conductor layers which are separated by microelectronic dielectric layers.

Integral to the fabrication of microelectronic fabrications is the fabrication within microelectronic fabrications of bond pads which are typically formed within a microelectronic fabrication as a terminal patterned conductor layer when fabricating the microelectronic fabrication. Bond pads are clearly desirable and essential within the art of microelectronic fabrication when fabricating microelectronic fabrications insofar as bond pads provide a means for electrically connecting and interconnecting various types of microelectronic fabrications to provide fully functional microelectronic fabrication products. Similarly, and also integral to the fabrication of microelectronic fabrications is the fabrication within microelectronic fabrications of passivation layers which generally passivate pond pads, but through which passivation layers are formed vias which access bond pads for purposes of electrically connecting and interconnecting various types of microelectronic fabrications when providing fully functional microelectronic fabrication products. Similarly, in turn, passivation layers are also clearly desirable and essential within the art of microelectronic fabrication insofar as passivation layers, in particular when having formed therethrough vias accessing bond pads, typically provide for edge passivation of bond pads which in turn provides for enhanced reliability of microelectronic fabrications within which are formed such edge passivated bond pads.

While both bond pads and passivation layers are thus clearly desirable in the art of microelectronic fabrication, both bond pads and passivation layers are not fabricated entirely without problems in the art of microelectronic fabrication. In that regard, it is often desirable within the art of microelectronic fabrication, but not always readily achievable within the art of microelectronic fabrication, to provide, with enhanced and dimensionally stabilized planarization, passivation layers passivating bond pads within microelectronic fabrications.

It is thus towards the foregoing object that the present invention is directed.

Various passivation methods and passivation materials have been disclosed in the art of microelectronic fabrication for forming passivation layers which passivate structures including but not limited to bond pads within microelectronic fabrications.

For example, Jin et al., in U.S. Pat. No. 5,883,001, discloses a passivation method and a passivation structure for passivating, with among other features, an enhanced optical clarity, an electrically erasable programmable read only memory (EEPROM) cell and an adjacent bond pad within a electrically erasable programmable read only memory (EEPROM) microelectronic fabrication. To realize the foregoing object, the passivation method and the passivation structure employ forming over the electrically erasable programmable read only memory (EEPROM) cell and the adjacent bond pad a sandwich composite planarizing dielectric layer construction comprising a pair of conformal silicon oxide dielectric layers between which is sandwiched a spin-on-glass (SOG) planarizing dielectric layer, and through which sandwich composite planarizing dielectric layer construction is formed a via accessing the bond pad while employing an isotropic etch method followed by an anisotropic etch method.

In addition, Dass et al., in U.S. Pat. No. 6,046,101, discloses a method for forming, with enhanced interfacial adhesion, a multi-layer passivation layer employed for passivating a bond pad within a microelectronic fabrication, wherein the multi-layer passivation layer comprises a silicon nitride passivation layer having formed thereover an otherwise generally minimally adherent polyimide passivation layer. To realize the foregoing object, the multi-layer passivation layer employs formed in-situ upon the silicon nitride passivation layer prior to forming thereover the otherwise generally minimally adherent polyimide passivation layer a silicon oxynitride adhesion promotion layer.

Desirable in the art of microelectronic fabrication are additional methods and materials which may be employed for forming within microelectronic fabrications passivation layers which passivate bond pad layers within microelectronic fabrications, wherein the passivation layers are formed with enhanced and dimensionally stabilized planarization.

It is towards the foregoing object that the present invention is directed.

SUMMARY OF THE INVENTION

A first object of the present invention is to provide a method for forming within a microelectronic fabrication a passivation layer passivating a bond pad.

A second object of the present invention is to provide a method in accord with the first object of the present invention, wherein the passivation layer is formed with enhanced and dimensionally stabilized planarization.

A third object of the present invention is to provide a method in accord with the first object of the present invention and the second object of the present invention, wherein the method is readily commercially implemented.

In accord with the objects of the present invention, there is provided by the present invention a method for forming a microelectronic fabrication. To practice the method of the present invention, there is first provided a substrate. There is then formed over the substrate a patterned conductor layer having a topographic variation at a periphery of the patterned conductor layer. There is then formed over the substrate and passivating the topographic variation at the periphery of the patterned conductor layer a planarizing passivation layer formed of a thermally reflowable material. There is then formed upon the planarizing passivation layer a dimensionally stabilizing layer. Finally, there is then thermally annealed the microelectronic fabrication to form from the planarizing passivating layer a thermally annealed planarizing passivating layer. Within the present invention, by employing formed upon the planarizing passivation layer the dimensionally stabilizing layer, there is attenuated within the thermally annealed planarizing passivation layer replication of the topographic variation at the periphery of the patterned conductor layer.

The present invention provides a method for forming within a microelectronic fabrication a passivation layer passivating a bond pad, wherein the passivation layer is formed with enhanced and dimensionally stabilized planarization. The present invention realizes the foregoing object by employing when forming a microelectronic fabrication having formed therein a patterned conductor layer (which may be a bond pad) having at its periphery a topographic variation which is passivated with a planarizing passivation layer formed of a thermally reflowable material a dimensionally stabilizing layer formed upon the planarizing passivation layer such that upon thermally annealing the microelectronic fabrication and forming from the planarizing passivation layer a thermally annealed planarizing passivation layer, there is attenuated within the thermally annealed planarizing passivation layer replication of the topographic variation at the periphery of the patterned conductor layer.

The method of the present invention is readily commercially implemented. The present invention employs methods and materials as are generally known in the art of microelectronic fabrication, but employed within the context of a specific process ordering to provide the present invention. Since it is thus a specific process ordering which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronic fabrication a passivation layer passivating a bond pad, wherein the passivation layer is formed with enhanced and dimensionally stabilized planarization. The present invention realizes the foregoing object by employing when forming a microelectronic fabrication having formed therein a patterned conductor layer (which may be a bond pad) having at its periphery a topographic variation which is passivated with a planarizing passivation layer a dimensionally stabilizing layer formed upon the planarizing passivation layer such that upon thermally annealing the microelectronic fabrication and forming from the planarizing passivation layer a thermally annealed planarizing passivation layer, there is attenuated within the thermally annealed planarizing passivation layer replication of the topographic variation at the periphery of the patterned conductor layer.

Although the preferred embodiment of the present invention illustrates the present invention within the context of passivating, with dimensionally stabilized planarization, a bond pad within a microelectronic fabrication, the present invention may alternatively be employed for passivating, with dimensionally stabilized planarization, other types of patterned conductor layers within microelectronic fabrications.

Similarly, although the preferred embodiment of the present invention illustrates the present invention most particularly within the context of a planarizing passivation layer formed of a photoimageable polyimide mateiral and a dimensionally stabilizing layer formed of a photoresist material, the objects of the present invention may also be realized while employing for a dimensionally stabilizing layer an inorganic material or an organic material. Similarly, while the present invention has particular utility in passivating bond pads having at their peripheries topographic variations within semiconductor integrated circuit microelectronic fabrications, the present invention may also be employed when fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
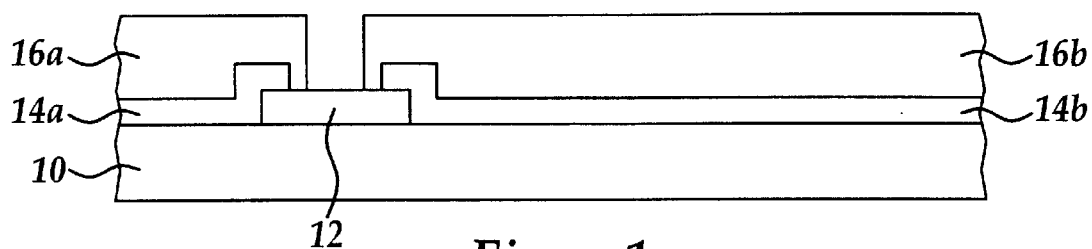
FIG. 1 and FIG. 2 show a pair of schematic cross-sectional diagrams of a microelectronic fabrication illustrating thermally annealed patterned planarizing passivation dielectric layer non-planarity and attendant topographic variation replication within a thermally annealed patterned planarizing passivation dielectric layer.
Figure 2:
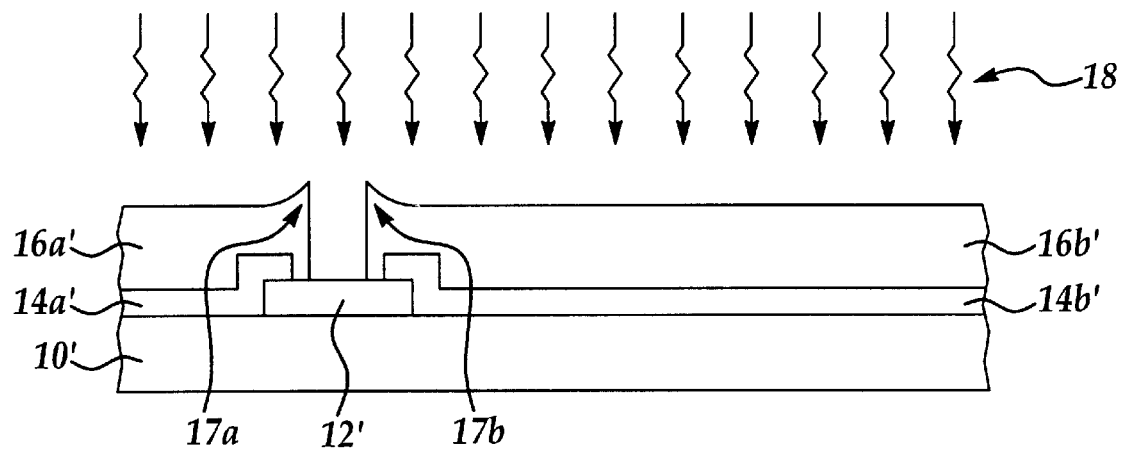

Referring now to FIG. 1 and FIG. 2, there is show a pair of schematic cross-sectional diagrams of a microelectronic fabrication illustrating in greater detail a problem towards which the present invention is directed. As is understood by a person skilled in the art, the problem relates to thermally annealed planarizing passivation layer non-planarity and attendant topographic variation replication within a thermally annealed planarizing passivation layer formed upon thermal annealing of a planarizing passivation layer formed of a material which is susceptible to thermal reflow.

Shown in FIG. 1 is a schematic cross-sectional diagram of the microelectronic fabrication prior to thermally annealing the planarizing passivation layer.

Shown in FIG. 1, in a first instance, is a substrate 10 having formed thereover a bond pad 12. In turn, the bond pad 12 is passivated with a pair of patterned first conformal passivation dielectric layers 14a and 14b which in conjunction with the bond pad 12 provide a pair of topographic variations at the periphery of the bond pad 12. Shown also within the schematic cross-sectional diagram of FIG. 1 is a pair of patterned second planarizing passivation dielectric layers 16a and 16b which: (1) further passivate a portion of the bond pad 12 while defining a second via which exposes a portion of the bond pad; and also (2) passivate the pair of patterned first conformal passivation dielectric layers 14a and 14b which define a first via accessing the bond pad 12. Within the preferred embodiment of the present invention, the pair of patterned second planarizing passivation dielectric layers 16a and 16b is formed of a thermally reflowable material. As is understood by a person skilled in the art, although the schematic cross-sectional diagram of FIG. 1 illustrates the pair of patterned first conformal passivation dielectric layers 14a and 14b, as well as the pair of patterned second planarizing passivation dielectric layers 16a and 16b, as separate patterned dielectric layers, the pair of patterned first conformal passivation dielectric layers 14a and 14b comprises a single patterned first conformal passivation dielectric layer which defines the first via which accesses the bond pad 12 and the pair of patterned second planarizing passivation dielectric layers 16a and 16b comprise a single patterned second planarizing passivation dielectric layer which defines the second via of a real dimension smaller than the first via and contained within the first via.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated is FIG. 1, but wherein the microelectronic fabrication has been thermally annealed within a thermally annealing environment 18, as is commonly employed for fully thermally curing the pair of patterned second planarizing passivation dielectric layers 16a and 16b, particularly when formed of an organic polymer thermally reflowable material, such as a polyimide organic polymer thermally reflowable material. Within the schematic cross-sectional diagram of FIG. 2, all layers, which are now thermally annealed layers, are designated by a prime as a suffix within their reference numerals. As is illustrated within the schematic cross-sectional diagram of FIG. 2, upon thermally annealing the pair of patterned second planarizing passivation dielectric layers 16a and 16b, there is formed within the resulting pair of thermally annealed patterned second planarizing passivation dielectric layers 16a' and 16b' a corresponding pair of cusps 17a and 17b, which generally replicate the topographic variation at the periphery of a thermally annealed bond pad 12' at the location of a pair of thermally annealed patterned first conformal passivation dielectric layers 14a' and 14b'.

For reasons which will become more apparent within the context of some additional description below, the pair of cusps 17a and 17b is generally undesirable within the microelectronic fabrication whose schematic cross-sectional diagram is illustrated in FIG. 2 insofar as the pair of cusps 17a and 17b provides an inferior substrate surface upon which may be formed additional microelectronic layers within a microelectronic fabrication related to the microelectronic fabrication whose schematic cross-sectional diagram is illustrated in FIG. 2.

Figure 3:
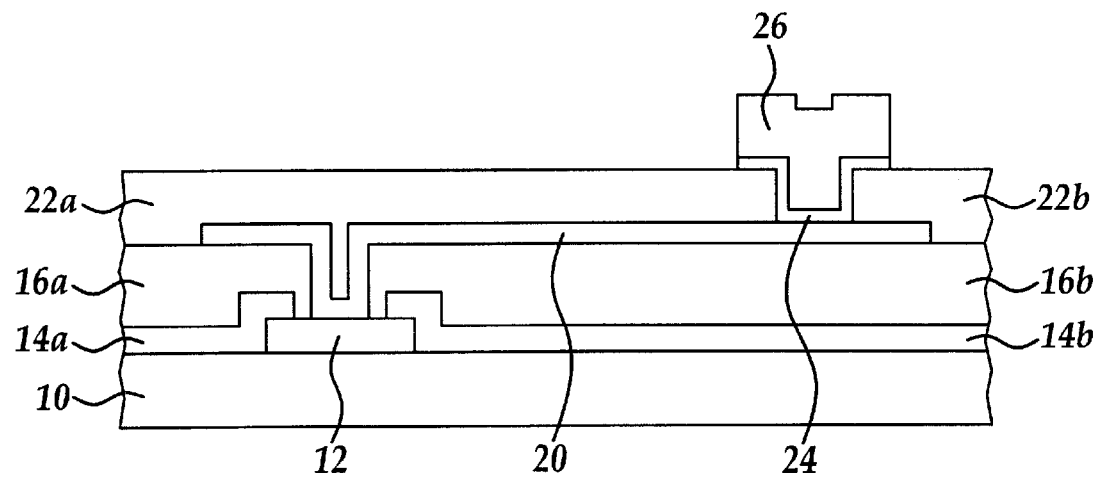
FIG. 3 and FIG. 4 show a pair of schematic cross-sectional diagrams illustrating the results of further processing of the microelectronic fabrication whose schematic cross-sectional diagram is illustrated in FIG. 1.
Figure 4:
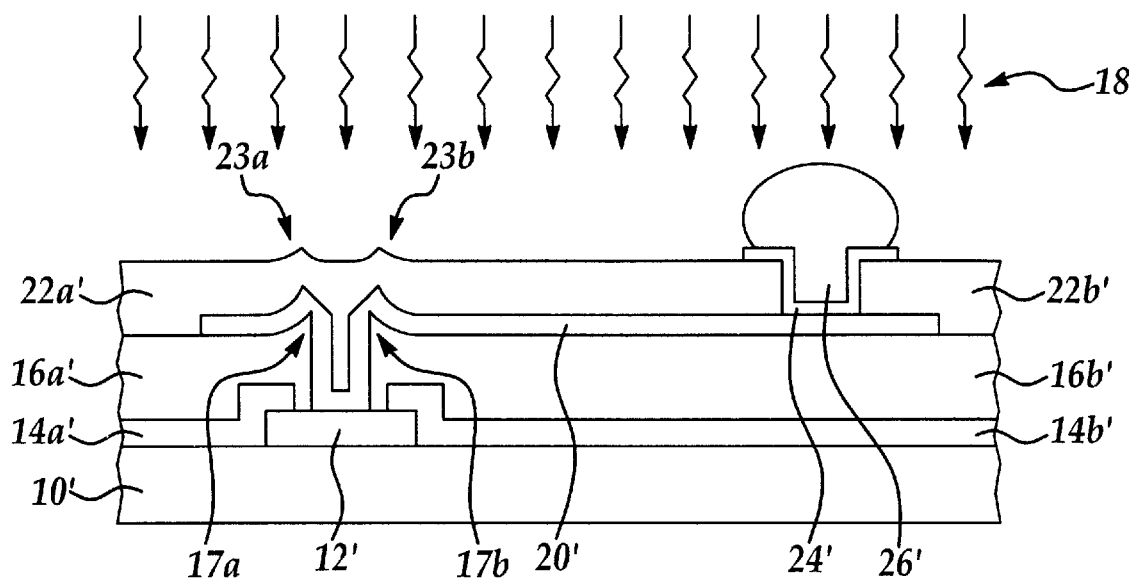

Referring now to FIG. 3 and FIG. 4, there is shown a pair of schematic cross-sectional diagrams illustrating the results of further processing of the microelectronic fabrication whose schematic cross-sectional diagram is illustrated in FIG. 1.

Shown in FIG. 3 is a schematic cross-sectional diagram of a microelectronic fabrication otherwise equivalent to the microelectronic fabrication whose schematic cross-sectional diagram is illustrated in FIG. 1, but instead of immediately thermally annealing the microelectronic fabrication whose schematic cross-sectional diagram is illustrated in FIG. 1 to provide the microelectronic fabrication whose schematic cross-sectional diagram is illustrated in FIG. 2, there is instead further fabricated the microelectronic fabrication whose schematic cross-sectional diagram is illustrated in FIG. 1 at a comparatively low temperature such as to avoid formation within the pair of thermally annealed patterned second planarizing passivation dielectric layers 16a' and 16b' as illustrated within the schematic cross-sectional diagram of FIG. 2, the pair of cusps 17a and 17b.

In the process of further fabricating the microelectronic fabrication whose schematic cross-sectional diagram is illustrated in FIG. 1 to provide the microelectronic fabrication whose schematic cross-sectional diagram is illustrated in FIG. 3, there is first formed upon the pair of patterned second planarizing passivation dielectric layers 16a and 16b and contacting the bond pad 12 within the second via defined by the pair of patterned second planarizing passivation dielectric layers 16a and 16b a patterned redistribution layer 20. In turn the patterned redistribution layer 20 has formed thereupon a pair of patterned third planarizing passivation dielectric layers 22a and 22b which define a third via which accesses a remote portion of the patterned redistribution layer 20. The pair of patterned third planarizing passivation dielectric layers 22a and 22b is typically and prefrably formed of a thermally reflowable material generally analogous or equivalent with the thermally reflowable material from which is formed the pair of patterned second planarizing passivation dielectric layers 16a and 16b. Finally, there is illustrated within the schematic cross-sectional diagram of FIG. 3 formed into the third via a patterned barrier layer 24 upon which is formed a patterned solder layer 26.

Fabrication of a microelectronic fabrication analogous or equivalent to the microelectronic fabrication whose schematic cross-sectional diagram is illustrated in FIG. 3, absent intervening thermal annealing process steps when forming the various layers, is desirable and common in the art of microelectronic fabrication insofar as it is often desirable in the art of microelectronic fabrication to employ a single thermal annealing process step after forming a series of patterned solder layers upon a microelectronic fabrication, insofar as it is often desirable in the art of microelectronic fabrication to limit thermal annealing time and temperature budgets when fabricating microelectronic fabrications.

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the microelectronic fabrication has been thermally annealed within the same thermally annealing environment 18 as employed for thermally annealing the microelectronic fabrication whose schematic cross-sectional diagram is illustrated in FIG. 2 to thus form from various of the layers within the microelectronic fabrication whose schematic cross-sectional diagram is illustrated in FIG. 3 thermally annealed layers which are also designated by a prime as a suffix within their reference numerals, and wherein in particular the patterned solder layer 26 when thermally annealed provides a thermally annealed reflowed patterned solder layer 26'.

Also shown within the schematic cross-sectional diagram of FIG. 4 is the pair of cusps 17a and 17b within the pair of thermally annealed patterned second planarizing passivation dielectric layers 16a' and 16b' wherein the pair of cusps 17a and 17b is further replicated to form a pair of replicated cusps 23a and 23b within a thermally annealed patterned third planarizing passivation dielectric layer 22a'. Unfortunately, the pair of cusps 17a and 17b also replicate through the thermally annealed patterned redistribution layer 20' in a fashion which provides thinning therein and possible rupture, which in turn provides functionality and reliability problems within the microelectronic fabrication whose schematic cross-sectional diagram is illustrated in FIG. 4, in comparison with the microelectronic fabrication whose schematic cross-sectional diagram is illustrated in FIG. 3.

It is thus desirable in the art of microelectronic fabrication to provide methods and materials through which there may be avoided cusps formed within a thermally annealed planarizing passivation dielectric layer formed of a thermally reflowable material, such as the pair of cusps 17a and 17b within the pair of thermally annealed patterned planarizing passivation dielectric layers 16a' and 16b' formed of the thermally reflowable material in accord with the foregoing discussion, so that there in turn may be formed microelectronic fabrications with enhanced functionality and reliability. It is towards resolution of this specific problem observed within the context of the present invention that the present invention is directed.

Referring now to FIG. 5 to FIG. 8, there is show a series of schematic cross-sectional diagrams illustrating the results of progressive stages in forming, in accord with a preferred embodiment of the present invention, a microelectronic fabrication having formed therein a bond pad having at its periphery a topographic variation which is passivated with a planarizing passivation layer formed of a thermally reflowable material, and wherein the planarizing passivation layer exhibits enhanced and dimensionally stabilized planarization.

Figure 5:
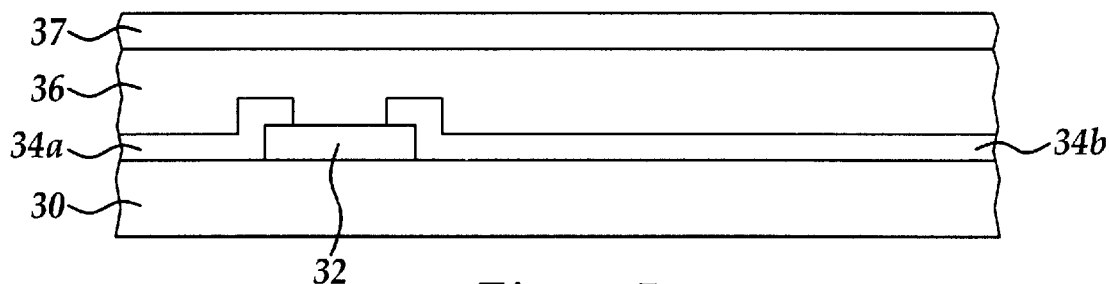
FIG. 5, FIG. 6, FIG. 7 and FIG. 8 show a series of schematic cross-sectional diagrams illustrating the results of progressive stages in forming, in accord with a preferred embodiment of the present invention, a microelectronic fabrication having formed therein a bond pad which is passivated with a patterned planarizing passivation dielectric layer having enhanced and dimensionally stabilized planarization.

Shown in FIG. 5 is a schematic cross-sectional diagram of the microelectronic fabrication at an early stage in its fabrication in accord with the preferred embodiment of the present invention.

Shown in FIG. 5, in a first instance, is a substrate 30 having formed thereover a bond pad 32.

Within the preferred embodiment of the present invention with respect to the substrate 30, the substrate 30 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic fabrications. Although not specifically illustrated within the schematic cross-sectional diagram of FIG. 5, the substrate 30 may consist of a substrate alone as employed within a microelectronic fabrication, or in an alternative, the substrate 30 may comprise a substrate as employed within the microelectronic fabrication, wherein the substrate as employed within the microelectronic fabrication has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed of microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 5, the substrate 30, typically and preferably when the substrate 30 consists of or comprises a semiconductor substrate employed within a semiconductor integrated circuit microelectronic fabrication, has formed therein and/or thereupon microelectronic devices as are conventional within the microelectronic fabrication within which is employed the substrate 30. Such microelectronic devices may be selected from the group including but not limited to resistors, transistors, diodes and capacitors.

Within the preferred embodiment of the present invention with respect to the bond pad 32, the bond pad 32 may be formed of conductor materials as are conventional in the art of microelectronic fabrication, such conductor materials being selected from the group including but not limited to metal conductor materials, metal alloy conductor materials, doped polysilicon (having a dopant concentration of greater than about 1E18 atoms per cubic centimeter) conductor materials and polycide (doped polysilicon/metal silicide stack) conductor materials.

Typically and preferably, the bond pad 32 is formed of a metal or metal alloy conductor material, typically and preferably an aluminum, aluminum alloy, copper or copper alloy conductor material, formed to a thickness of from about 10,000 to about 20,000 angstroms and having a bidirectional a real linewidth of from about 60 to about 120 microns.

Shown also within the schematic cross-sectional diagram of FIG. 5 and passivating a pair of edges of the bond pad 32 is a pair of patterned first conformal passivation dielectric layers 34a and 34b which provide a topographic variation at the periphery of the bond pad 32. The pair of patterned first conformal passivation dielectric layers 34a and 34b is analogous or equivalent to the pair of patterned first conformal passivation dielectric layers 14a and 14b as illustrated within the schematic cross-sectional diagram of FIG. 1. The pair of patterned first conformal passivation dielectric layers 34a and 34b is typically and preferably formed of a silicon containing dielectric material, such as but not limited to a silicon oxide dielectric material, a silicon nitride dielectric material or a silicon oxynitride dielectric material. Typically and preferably, each of the pair of patterned first conformal passivation dielectric layers 34a and 34b is formed to a thickness of from about 5,000 to about 7,000 angstroms while full passivating the edges of the bond pad 32 to provide the topographic variation at the periphery of the bond pad 32 while defining a first via which exposes a portion of the bond pad 32. Within the preferred embodiment of the present invention, the first via has a bidirectional areal aperture width of from about 40 to about 100 microns.

Shown also within the schematic cross-sectional diagram of FIG. 5 formed upon exposed portions of the pair of patterned first conformal passivation dielectric layers 34a and 34b and the bond pad 32 is a blanket second planarizing passivation dielectric layer 36 in turn having formed thereupon a blanket dimensionally stabilizing layer 37.

Within the preferred embodiment of the present invention with respect to the blanket second planarizing passivation dielectric layer 36, the blanket second planarizing passivation dielectric layer 36 is. analogously with the pair of patterned first planarizing passivation dielectric layers 16a and 16b as illustrated within the schematic cross-sectional diagram of FIG. 1, formed of a thermally reflowable material. More typically and preferably, the thermally reflowable material is an organic polymer thermally reflowable material selected from the group consisting of polyimide organic polymer thermally reflowable materials and polyarylene other organic polymer thermally reflowable materials. Yet more preferably, the blanket second planarizing passivation dielectric layer 36 is fanned of a photoimageable polyimide organic polymer thermally reflowable material. Still yet more preferably, the blanket second planarizing passivation dielectric layer 36 is formed of a photolmageable polyimide organic polymer thermally reflowable material of a negative tone. Typically and preferably, the blanket second planarizing passivation dielectric layer 36 is formed to a thickness of from about 30,000 to about 50,000 angstroms.

Within the preferred embodiment of the present invention with respect to the blanket dimensionally stabilizing layer 37, and although other materials may be employed for forming the blanket dimensionally stabilizing layer 37, including but not limited to inorganic materials and organic materials, the blanket dimensionally stabilizing layer 37 is typically and preferably formed of a photoresist material, typically and preferably of a tone equivalent to the tone of the blanket second planarizing passivation dielectric layer 36 when formed of a photoimageable organic polymer thermally reflowable material, and thus more typically and preferably of a negative tone. More typically and preferably, the blanket dimensionally stabilizing layer 37 is formed of a negative tone acrylic photoresist mateiral which is susceptible to substantial cross-linking upon photoexposure and development when forming a pair of patterned dimensionally stabilizing layers from the blanket dimensionally stabilizing layer 37 (i.e., sufficient cross-linking such that the pair of patterned dimensionally stabilizing layers exhibits no appreciable thermal reflow at a temperature which is reflowed a pair of patterned second planarizing passivation dielectric layers derived from the blanket second planarizing passivation dielectric layer 36. For example and without limitation, such a negative tone acrylic photoresist material which is susceptible to substantial cross-linking upon photoexposure and development is available from ASAHI Chemical Industry Co., Ltd, 2-1 Samejima, Fuji Shizuoka, 416-8501, Japan as product number I8320 negative tone photoresist mateiral. Typically and preferably, the blanket dimensionally stabilizing layer 37 is formed to a thickness of from about 20,000 to about 40,000 angstroms.

Figure 6:
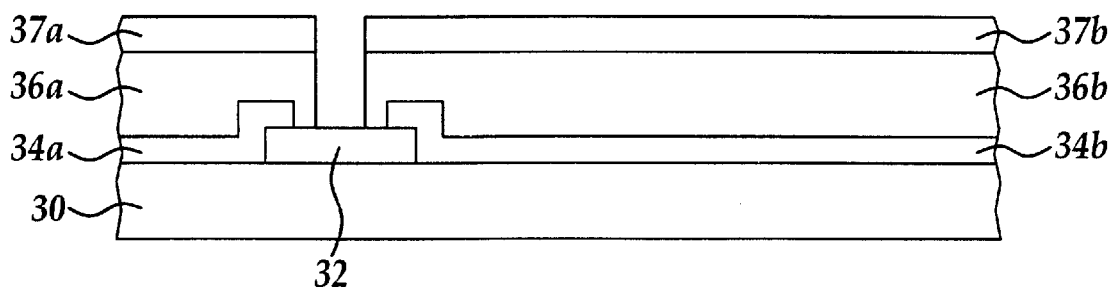

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein the blanket second planarizing passivation dielectric layer 36 has been patterned to form a pair of patterned second planarizing passivation dielectric layers 36a and 36b, and the blanket dimensionally stabilizing layer 37 has been patterned to form a pair of patterned dimensionally stabilizing layers 37a and 37b, while simultaneously forming a second via which accesses the bond pad 32.

Within the preferred embodiment of the present invention, the second via as illustrated within the schematic cross-sectional diagram of FIG. 6 may be formed incident to a simultaneous patterning of the blanket dimensional stabilizing layer 37 (when formed of a (preferably negative tone) photoresist mateiral) and the blanket second planarizing passivation dielectric layer 36 (when formed of a (preferably negative tone) photoimageable polyimide organic polymer material) while employing methods are conventional in the art of microelectronic fabrication, wherein such methods will typically and preferably employ photolithographic exposure and development methods as are conventional in the art of microelectronic fabrication and are otherwise appropriate for the materials from which are formed the blanket second planarizing passivation dielectric layer 36 and the blanket dimensional stabilizing layer 37.

Figure 7:
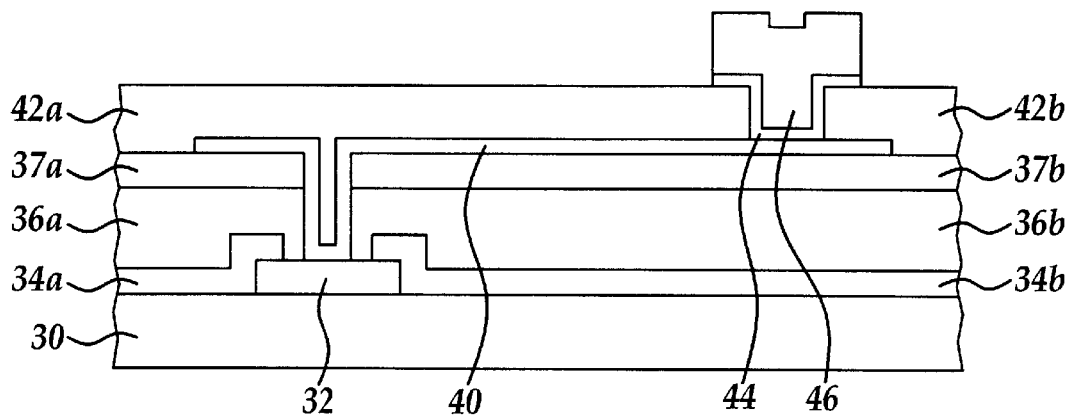

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein: (1) there is formed upon the pair of patterned dimensional stabilizing layers 37a and 37b, and into the second via, a patterned redistribution layer 40; (2) there is formed passivating the patterned redistribution layer 40 and portions of the patterned dimensionally stabilizing layers 37a and 37b a pair of patterned third planarizing passivation dielectric layers 42a and 42b which define a third via which accesses a remote portion of the patterned redistribution layer 40; (3) there is formed into the third via and contacting the remote portion of the patterned redistribution layer 40 a patterned barrier layer 44 in turn having formed thereupon a patterned solder layer 46.

Within the preferred embodiment of the present invention with respect to the patterned redistribution layer 40, the patterned redistribution layer 40 may be formed of redistribution conductor materials as are conventional in the art of microelectronic fabrication, such redistribution conductor materials being selected from the group including but not limited to metal, metal alloy, doped polysilicon and polycide redistribution conductor materials. Typically and preferably, the patterned redistribution layer 40 is formed to a thickness of from about 10,000 to about 25,000 angstroms.

Within the preferred embodiment of the present invention with respect to the pair of patterned third planarizing passivation dielectric layers 42a and 42b, the pair of patterned third planarizing passivation dielectric layers 42a and 42b is typically and preferably formed of a photoimageable organic polymer dielectric mateiral analogous or equivalent to the photoimageable organic polymer dielectric material from which is typically and preferably formed the pair of patterned second planarizing passivation dielectric layers 36a and 36b. Typically and preferably, the pair of patterned third planarizing passivation dielectric layers 42a and 42b is formed to a thickness of from about 30,000 to about 50,000 angstroms.

Within the preferred embodiment of the present invention with respect to the patterned barrier layer 44, the patterned barrier layer 44 is typically and preferably formed of a barrier mateiral as is conventional in the art of microelectronic fabrication, such barrier materials generally being selected from the group including but not limited to metal, metal alloy, metal nitride and metal alloy nitride barrier materials. Typically and preferably, the patterned barrier layer 44 is formed of a titanium, and copper material formed within the third via to a thickness of from about 50,000 to about 80,000 angstroms.

Finally, within the preferred embodiment of the present invention with respect to the patterned solder layer 46, the patterned solder layer 46 may be formed of solder materials as are conventional in the art of microelectronic fabrication, such solder materials being selected from the group including but not limited to lead, lead alloy, tin, tin alloy, antimony and antimony alloy solder materials. Typically and preferably, the patterned solder layer 46 is formed upon the patterned barrier layer 44 to a thickness of from about 80 to about 150 microns.

Figure 8:
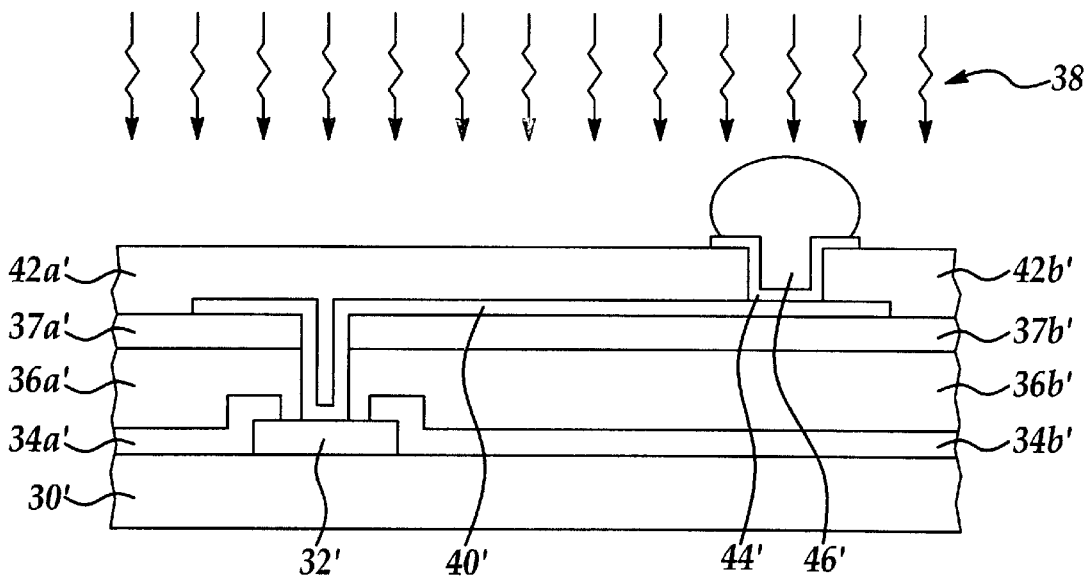

Referring now to FIG. 8, there is shown a schematic cross-sectional diagram illustrating the results of further processing of the microelectronic fabrication whose schematic cross-sectional diagram is illustrated in FIG. 7.

Shown in FIG. 8 is a schematic cross-sectional diagram of a microelectronic fabrication otherwise equivalent to the microelectronic fabrication whose schematic cross-sectional diagram is illustrated in FIG. 7, but wherein the microelectronic fabrication has been treated within a thermal annealing environment 38 to form from each of the layers within the microelectronic fabrication whose schematic cross-sectional diagram is illustrated in FIG. 7 a thermally annealed layer which is designated by a prime as a suffix within each of the reference numerals which refer to the corresponding layers, and wherein the thermally annealed patterned solder layer is in particular formed as a thermally annealed reflowed patterned solder layer 46'.

Within the preferred embodiment of the present invention, the thermal annealing environment 38 is selected of composition and temperature such that there is fully thermally cured the pair of thermally annealed patterned second planarizing passivation dielectric layers 36a' and 36b' and the pair of thermally annealed patterned third planarizing passivation dielectric layers 42a' and 42b', while simultaneously reflowing the patterned solder layer 46 to form the thermally annealed reflowed patterned solder layer 46'. Typically and preferably, such a thermal annealing environment will employ a temperature of from about 200 to about 360 degrees centigrade for a time period of from about 20 to about 60 seconds within any of several ambient environments, but in particular reducing ambient environments, such as forming gas environments.

Upon forming the microelectronic fabrication whose schematic cross-sectional diagram is illustrated in FIG. 8, there is formed a microelectronic fabrication in accord with the preferred embodiment of the present invention. The microelectronic fabrication fabricated in accord with the preferred embodiment of the present invention has formed therein a pair of thermally annealed patterned dimensional stabilizing layers 37a' and 37b', which are formed of sufficient structural rigidity such as to attenuate upon thermal annealing of the microelectronic fabrication whose schematic cross-sectional diagram is illustrated in FIG. 7 to provide the microelectronic fabrication whose schematic cross-sectional diagram is illustrated in FIG. 8 replication of the topographic variation of the pair of patterned first conformal passivation dielectric layers 34a and 34b at the location of the bond pad 32 which would otherwise provide a pair of cusps within the thermally annealed patterned second planarizing passivating dielectric layers 36a' and 36b' and a pair of replicated cusps within the thermally annealed patterned third planarizing passivation dielectric layer 42a'.

As is understood by a person skilled in the art, the preferred embodiment of the present invention is illustrative of the present invention rather than limiting of the present invention. Revisions and modifications may be made to methods, materials, structures and dimensions through which may be provided a microelectronic fabrication in accord with the preferred embodiment of the present invention, while still providing a microelectronic fabrication in accord with the present invention, further in accord with the accompanying claims.

What is claimed is:

1. A method for forming a microelectronic fabrication comprising:
   providing a substrate;
   forming over the substrate a patterned conductor layer having a topographic variation at a periphery of the patterned conductor layer;
   forming over the substrate and passivating the topographic variation at the periphery of the patterned conductor layer a planarizing passivation layer formed of a thermally reflowable material;
   forming upon the planarizing passivation layer a dimensionally stabilizing layer; and
   thermally annealing the microelectronic fabrication to form from the planarizing passivation layer a thernally annealed planarizing passivation layer, after having formed upon the planarizing passivation layer the dimensionally stabilizing layer.

2. The method of claim 1 wherein by employing upon the planarizing passivation layer the dimensionally stabilizing layer, there is attenuated within the thermally annealed planarizing passivation layer replication of the topographic variation at the periphery of the patterned conductor layer.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the patterned conductor layer is formed from a conductor material selected from the group consisting of metals, metal alloys, doped polysilicon and polycides.

5. The method of claim 1 wherein the patterned conductor layer is a bond pad.

6. The method of claim 1 wherein the thermally reflowable material is selected from the group consisting of polyimide organic polymer materials and polyarylene ether organic polymer materials.

7. The method of claim 1 wherein the planarizing passivation layer is formed to a thickness of from about 30,000 to about 50,000 angstroms.

8. The method of claim 1 wherein the dimensionally stabilizing layer is formed from a dimensionally stabilizing material selected from the group consisting of inorganic materials and organic materials.

9. The method of claim 1 wherein the dimensionally stabilizing layer is formed to a thickness of from about 20,000 to about 10,000 angstroms.

10. The method of claim 1 wherein:
    the planarizing passivation layer is a patterned planarizing passivation layer formed of a photoimageable organic polymer material of negative tone;
    the dimensionally stabilizing layer is a patterned dimensionally stabilizing layer formed of a photoresist material of negative tone; and
    the patterned planarizing passivation layer and the patterned dimensionally stabilizing layer are formed simultaneously by photoexposure and development of a corresponding blanket planarizing passivation layer and a corresponding blanket dimensionally stabilizing layer to form the patterned planarizing passivating layer and the patterned dimensionally stabilizing layer defining a via which leaves exposed a portion of the bond pad.

11. The method of claim 10 wherein:

the photoimageable organic polymer material of negative tone is a polyimide photoimageable organic polymer material of negative tone; and the photoresist material of negative tone is an acrylic photoresist material of negative tone.

12. The method of claim 1 further comprising forming over the dimensionally stabilizing layer a second planarizing passivation layer.

13. The method of claim 12 wherein the second planarizing passivation layer is formed to a thickness of from about 30,000 to about 50,000 angstroms.

14. The method of claim 12 wherein the second planarizing passivation layer passivates a patterned redistribution layer formed interposed between the dimensionally stabilizing layer and the second planarizing passivation layer.

* * * * *